United States Patent
Litwiller

(10) Patent No.: US 7,212,240 B1
(45) Date of Patent: May 1, 2007

(54) IMAGER WITH A ROW OF PHOTODIODES OR PINNED PHOTO DIODES

(75) Inventor: David J. Litwiller, Heidelberg (CA)

(73) Assignee: Dalsa, Inc., Waterloo, Ontario (CA)

( * ) Notice: Subject to any disclaimer, the term of this patent is extended or adjusted under 35 U.S.C. 154(b) by 595 days.

(21) Appl. No.: 10/143,881

(22) Filed: May 14, 2002

Related U.S. Application Data

(60) Provisional application No. 60/293,195, filed on May 25, 2001.

(51) Int. Cl.
*H04N 3/14* (2006.01)

(52) U.S. Cl. ........................................ 348/294; 348/295

(58) Field of Classification Search ................ 348/294, 348/295, 297, 296, 298, 308, 310; 250/208.1; 257/231, 232, 226, E27.132, E27.133
See application file for complete search history.

(56) References Cited

U.S. PATENT DOCUMENTS

| | | | |
|---|---|---|---|
| 4,694,316 A * | 9/1987 | Chabbal | 257/231 |
| 4,879,601 A | 11/1989 | Buck et al. | |
| 5,051,797 A * | 9/1991 | Erhardt | 257/230 |
| 5,506,430 A | 4/1996 | Ohzu | |
| 5,543,641 A * | 8/1996 | Wadsworth et al. | 257/226 |
| 5,682,034 A | 10/1997 | Schueler | |
| 5,898,209 A | 4/1999 | Takakura | |
| 6,008,511 A | 12/1999 | Tokumitsu et al. | |
| 6,097,074 A | 8/2000 | Takakura | |
| 6,150,683 A | 11/2000 | Merrill et al. | |
| 6,392,260 B1 * | 5/2002 | Farrier et al. | 257/231 |
| 6,624,850 B1 * | 9/2003 | Guidash | 348/308 |
| 6,633,058 B1 * | 10/2003 | O. et al. | 257/232 |
| 6,670,860 B2 * | 12/2003 | Kobayashi et al. | 250/208.1 |

\* cited by examiner

*Primary Examiner*—David Ometz
*Assistant Examiner*—Luong T. Nguyen
(74) *Attorney, Agent, or Firm*—Millen, White, Zelano & Branigan, P.C.

(57) ABSTRACT

A TDI sensor includes a first readout register and a plurality of sensor columns. The first readout register includes a plurality of first readout register elements. A first sensor column includes a photogate and a diode photodetector at an end. The diode photodetector is either a photodiode or a pinned photodiode. The photogate is coupled through the diode photodetector and from there through a transfer gate to a corresponding readout register element.

17 Claims, 4 Drawing Sheets

| ••• | • | • | • | • | ••• |
|---|---|---|---|---|---|
| ••• | • | • | • | • | ••• |
| ••• | • | • | • | • | ••• |
| ••• | G | G | G | G | ••• |
| ••• | G | G | G | G | ••• |
| ••• | G | G | G | G | ••• |
| ••• | G | G | G | G | ••• |
| ••• | P | P | P | P | ••• |
| ••• | T | T | T | T | ••• |
| ••• | H | H | H | H | ••• |

LEGEND:
H = HCCD cell, T= Transfer structure cell
P = PD or PPD pixel cell, G = Photogate pixel cell (reticulated or not)

| | | | | | |
|---|---|---|---|---|---|
| • | • | • | • | • | • |
| • | • | • | • | • | • |
| • • • | • | • | • | • | • • • |
| • • • | G | G | G | G | • • • |
| • • • | G | G | G | G | • • • |
| • • • | G | G | G | G | • • • |
| • • • | G | G | G | G | • • • |
| • • • | P | P | P | P | • • • |
| • • • | T | T | T | T | • • • |
| • • • | H | H | H | H | • • • |

LEGEND:

H = HCCD cell, T= Transfer structure cell
P = PD or PPD pixel cell, G = Photogate pixel cell (reticulated or not)

FIG.1

| ... | H2 | H2 | H2 | H2 | ... |
|-----|----|----|----|----|-----|
| ... | T2 | T2 | T2 | T2 | ... |
| ... | P2 | P2 | P2 | P2 | ... |
| ... | G  | G  | G  | G  | ... |
| ... | G  | G  | G  | G  | ... |
| ... | G  | G  | G  | G  | ... |
| •   | •  | •  | •  | •  | •   |
| •   | •  | •  | •  | •  | •   |
| ... | •  | •  | •  | •  | ... |
| ... | G  | G  | G  | G  | ... |
| ... | G  | G  | G  | G  | ... |
| ... | G  | G  | G  | G  | ... |
| ... | G  | G  | G  | G  | ... |
| ... | P1 | P1 | P1 | P1 | ... |
| ... | T1 | T1 | T1 | T1 | ... |
| ... | H1 | H1 | H1 | H1 | ... |

LEGENDS:

H1 and H2 = HCCD cell, T1 and T2 = Transfer structure cell
P1 and P2 = PD or PPD pixel cell, G = Photogate pixel cell (reticulated or not)

FIG.2

IMAGER WITH A ROW OF PHOTODIODES OR PINNED PHOTO DIODES

The priority benefit of the May 25, 2001 filing date of provisional application 60/293,195 is hereby claimed.

BACKGROUND OF THE INVENTION

1. Field of the Invention

The present invention relates to a TDI image sensor architecture with a row of photodiodes or pinned photo diodes.

2. Description of Related Art

Quantum efficiencies typical of high quality photodiodes in linescan CCD image sensors, in the visible wavelengths, are on the order of 70%. However, quantum efficiencies of photogates as are typically used in TDI image sensors are on the order of 40% or even lower for red and green light, and as low as around 10% for blue light. Thus, under uniform illumination, the TDI image sensor must operate with between 2 and 7 photogate stages to accumulate the same electronic signal as its single photodiode linescan counterpart. This poses significant constraints of object-imager alignment and synchronization.

SUMMARY OF THE INVENTION

It is an object to the present invention to improve TDI sensors.

This and other objects are achieved in a TDI sensor includes a first readout register and a plurality of sensor columns. The first readout register includes a plurality of first readout register elements. A first sensor column includes a photogate and a diode photodetector at an end. The diode photodetector is either a photodiode or a pinned photodiode. The photogate is coupled through the diode photodetector and from there through a transfer gate to a corresponding readout register element.

This and other objects are also achieved in a method that includes steps of accumulating a first photocharge, transferring the first photocharge, accumulating a second photocharge, and transferring both the first and second photocharge. The step of accumulating a first photocharge accumulates the first photocharge in a photogate. The step of transferring the first photocharge transfers the first photocharge from the photogate to a photodiode. The step of accumulating a second photocharge accumulates the second photocharge in the photodiode. The step of transferring both the first and second photocharge transfers both the first and second photocharge from the photodiode to a readout register cell.

This and other objects are achieved in yet another method that includes steps of transferring accumulated signal charge, accumulating additional photocharge, and transferring the accumulated signal charge and the additional photocharge. The step of transferring accumulated signal charge transfers accumulated signal charge from a TDI column into a full aperture photodetector. The full aperture photodetector is either a photodiode or a pinned photodiode. The step of accumulating additional photocharge accumulates additional photocharge in the full aperture photodetector. The step of transferring the accumulated signal charge and the additional photocharge transfers the accumulated signal charge and the additional photocharge from the full aperture photodetector to a readout register.

BRIEF DESCRIPTION OF DRAWINGS

The invention will be described in detail in the following description of preferred embodiments with reference to the following figures wherein:

FIG. 1 is a schematic diagram of the proposed TDI imager architecture in the region nearest the HCCD, according to the invention;

FIG. 2 is a schematic diagram of a bi-directional TDI image sensor, according to an alternative embodiment of the invention;

DETAILED DESCRIPTION OF PREFERRED EMBODIMENTS

Figure 3:
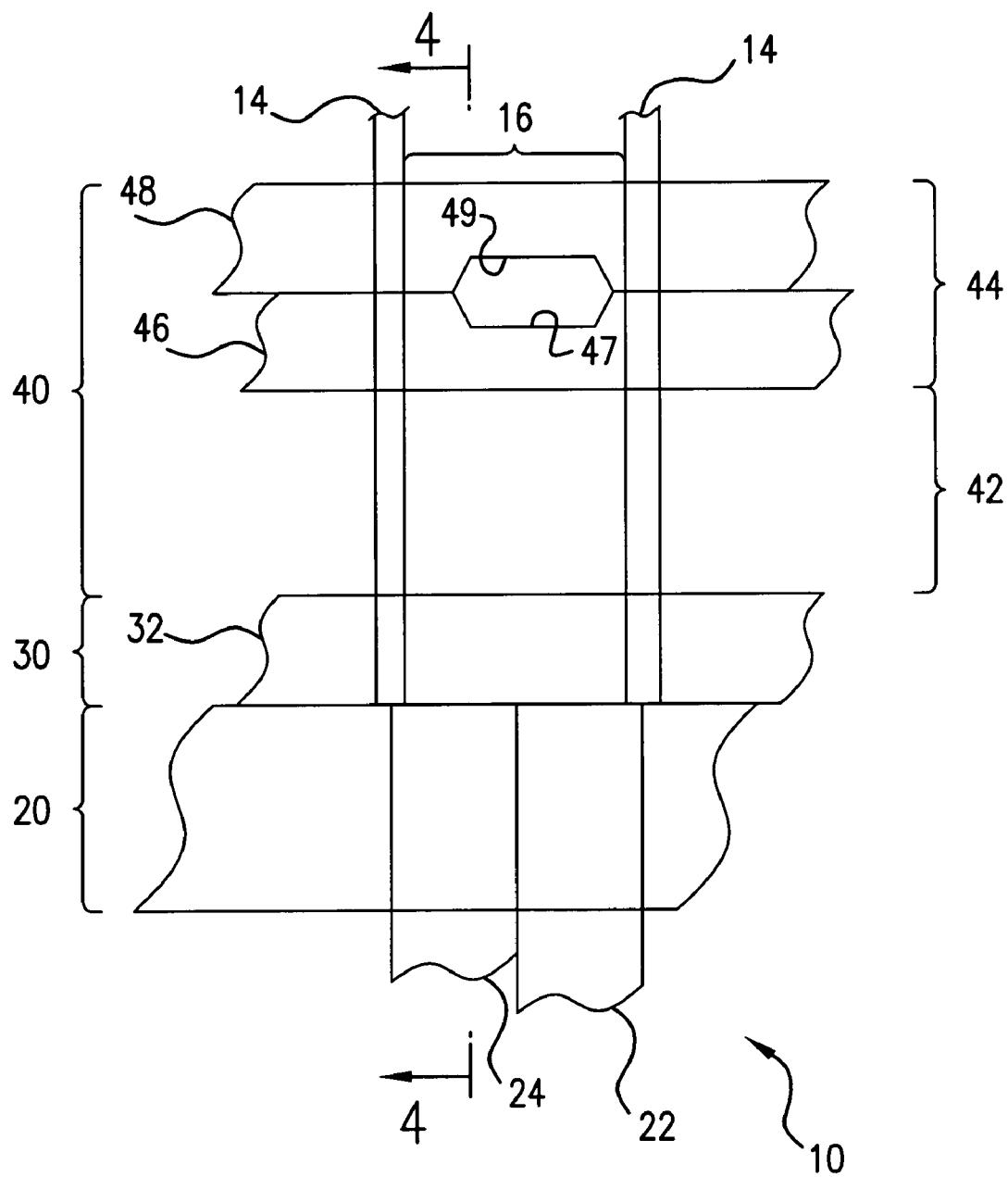
FIG. 3 is a plan view of an end region of a sensor, according to an alternative embodiment of the invention.

In FIG. 1, a TDI sensor includes a readout register, comprising cells H (for horizontal CCD readout register), transfer gates T and a plurality of pixels (sensing regions) arranged in rows and columns. One row of pixels is a row of photodiodes or pinned photodiodes denoted as cells P in FIG. 1. Between the readout register cells H and the row of photodiodes P is disposed a row of transfer gates T. The row of transfer gates T couple an output of an end row of the pixels (denoted P in FIG. 1) to the row of readout register cells H.

In each column of pixels, there is a photodiode PD (or pinned photodiode PPD) pixel, denoted P in FIG. 1, and one or more additional pixels of any type (typically photogates). The additional pixels in each column of the TDI image sensor are usually of photogate pixels, denoted in FIG. 1 as cells G, which may include reticulated photogates. In the present example, each column of the TDI sensor includes one or more photogate pixels that are disposed so that the corresponding photodiode PD (or pinned photodiode PPD) in the column is disposed between the photogate pixel or pixels and the corresponding transfer gate T. The photogate pixels may or may not be reticulated (i.e., have reticulated regions in their doped polycrystalline silicon clock lines to expose additional photodiode areas within a photogate).

In FIG. 2, an alternative embodiment, a bi-directional TDI image sensor, includes two readout registers at opposite ends of the sensor area, each readout register comprising cells H1 or H2 (for horizontal CCD readout register). The bi-directional sensor also includes transfer gates T1 and T2 and a plurality of pixels (sensing regions) arranged in rows and columns. One row of pixels at each end of the sensor array is a row of photodiodes PD or pinned photodiodes PPD denoted as cells P1 and P2 in FIG. 2. At one end of the sensor, between the readout register cells H1 and the row of photodiodes P1 is disposed a row of transfer gates T1. At another end of the sensor, between the readout register cells H2 and the row of photodiodes P2 is disposed a row of transfer gates T2. The row of transfer gates T1 couple outputs of an end row of the pixels (denoted P1 in FIG. 2) to the row of readout register cells H1 when the bi-directional TDI sensor is operated in one direction. The row of transfer gates T2 couple outputs of an end row of the pixels (denoted P2 in FIG. 2) to the row of readout register cells H2 when the bi-directional TDI sensor is operated in another direction. The sensor array is organized into a plurality of columns. Each column includes a photodiode PD (or pinned photodiode PPD) pixel at each end of the column, denoted in FIG. 2 as P1 and P2 respectively, and one or more additional pixels of any type (typically photogates) denoted G. The additional pixels in each column of the TDI image sensor are usually of photogate pixels, denoted in FIG. 2 as cells G, which may include reticulated photogates. In the present example, each column of the TDI sensor includes one or more photogate pixels that are disposed so that the corresponding photodiode PD (or pinned photodiode PPD) at each end of the corresponding column of pixels is disposed between the photogate pixel or pixels and the corresponding transfer gate T1 or T2 depending on which end of the column. The photogate pixels may or may not be reticulated (i.e., have reticulated regions in their doped polycrystalline silicon clock lines to expose additional photodiode areas within a photogate).

Figure 4:
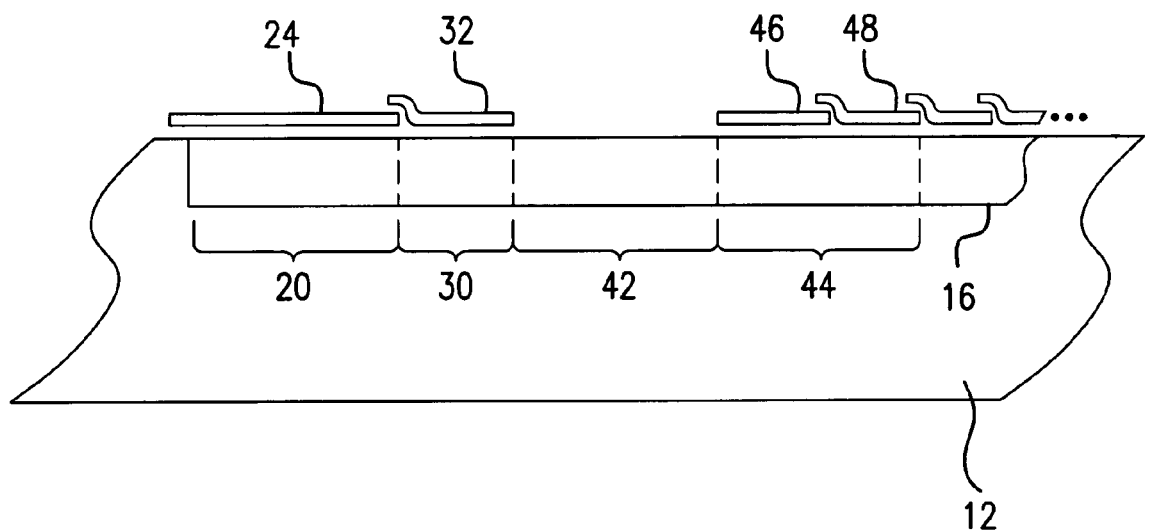
FIG. 4 is a section view of an end region of a sensor, according to an alternative embodiment of the invention.

In FIGS. 3 and 4, a plan and section view of an end region of a sensor according to another embodiment of the present invention. This embodiment is based on a two phase clocking scheme, but persons of ordinary skill in the art in light of these teachings will appreciate that this invention is also operable with 3 phase or 4 phase designs as well. Channel 16, preferably of an n conductivity type, is defined in substrate 12, preferably of a p conductivity type, between channel stops 14 (e.g., thick FOX or deep implants of a conductivity type to match substrate 12 and contrast with channel 16). This defines a buried channel design; however, persons of ordinary skill in the art will appreciate in light of these teaching that a surface channel design would also be operable as would a design based on a reversal of the conductivity types discussed above.

Horizontal CCD readout register 20 is also defined in substrate 12 and is clocked by clocking electrodes 22 and 24 (preferably doped polycrystalline silicon, poly). The transfer gates T, T1, T2 (FIGS. 1 and 2), denoted 30 in FIGS. 3 and 4, are formed by overlaying poly clock line 32, sometimes referred to as TCK (transfer clock). The end pixel in the column that is defined by channel 16 is defined by region 42 and bounded by channel stops 14. This region has no overlaying poly to block or diminish photons from reaching the channel. Thus, it is said to be a full aperture photodiode (although a variant would be a full aperture pinned photodiode). The pixel next to the full aperture photodiode defined in region 42 is a photogate defined by region 44 and bounded by channel stops 14. This region is overlayed by poly clocking lines 46, 48 for a two phase clocking structure. In the present example, the clocking lines are (for illustration purposes, but need not be) reticulated to expose a photodiode region below. Clocking line 46 is reticulated by reticulation 47 (a cut out), and clocking line 48 is reticulated by reticulation 49 (a cutout). However, the reticulation exposes a photodiode areas that is only a fraction of the full aperture of the pixel. The full aperture photodiode defined by region 42 between channel stops is a much larger area than the photodiode in the reticulation area.

In operation, photo accumulated charge is transferred through the photogate defined by region 44 into the photodiode defined by region 42 where photocharge continues to accumulate. Then, a positive voltage (e.g., 5 volts) is applied to both clock line 24 and transfer clock line 32 so that photo electrons (the charge) held in the photodiode will transfer to the readout register cell. Finally, transfer clock line 32 is returned to a more negative (e.g., 0 volts) compared to the voltage on clock line 24 so that the photo electrons will stay in the readout register cell. Then the readout register is transfer to off chip processing before the next row of pixels are again transferred into the readout register.

In a first method embodiment of the invention a method includes steps of accumulating a first photocharge, transferring the first photocharge, accumulating a second photocharge and transferring both the first and second photocharge. The step of accumulating a first photocharge accumulates the first photocharge in a photogate (region 44 of FIGS. 3, 4). The step of transferring the first photocharge, transfers the first photocharge from the photogate to a photodiode (region 42 of FIGS. 3, 4). The step of accumulating a second photocharge accumulates the second photocharge in the photodiode in addition to holding the first photocharge in the photodiode. The step of transferring both the first and second photocharge transfer the first and second photocharge through the transfer gates (region 30 of FIGS. 3, 4) from the photodiode (region 42 of FIGS. 3, 4) to a readout register cell (region 20 of FIGS. 3, 4).

In another embodiment, in addition to steps of the first method embodiment, a method further includes steps of accumulating a third photocharge and transferring the third photocharge. The step of accumulating a third photocharge accumulates the third photocharge in the photogate after the first photocharge is transferred to the photodiode and while the step of accumulating a second photocharge accumulates the second photocharge in the photodiode. The step of transferring the third photocharge transfers the third photocharge from the photogate to the photodiode after the third photocharge is accumulated in the photogate and while the step of transferring both the first and second photocharge transfers both the first and second photocharge from the photodiode to the readout register cell.

In another embodiment, in addition to steps of the first method embodiment, a method further includes scanning a portion of an image conjugate of a scene to be imaged from the photogate to photodiode in the span of a first time interval. The first time interval is substantially equal to a time interval between when the step of transferring the first photocharge transfers the first photocharge from the photogate to a photodiode and when the step of transferring both the first and second photocharge transfers both the first and second photocharge from the photodiode to the readout register cell. The step of scanning generally includes using a lens to form a conjugate image at a conjugate image plane where the sensor of the invention is disposed. Then, either the image moves by the lens so the conjugate image moves across the present sensor invention, or the sensor invention moves across the conjugate image to provide relative motion. The moving sensor need only move relative to the image conjugate, and other arrangements include implementations using moving or rotating mirrors to form a folded optical path that scans the image conjugate across the sensor. As a portion of the image conjugate moves across the sensor from being focused on the photogate to the photodiode, the step of transferring the first photocharge transfers the first photocharge from the photogate to a photodiode in order to continue accumulating photocharge in the photodiode. Then, when the portion of the image conjugate moves past the photodiode, the step of transferring both the first and second photocharge transfers both the first and second photocharge from the photodiode to the readout register cell.

In yet another method embodiment of the invention, the method includes a step of transferring accumulated signal charge from a TDI column (e.g., photogates G of FIGS. 1 and 2) into a full aperture photodetector (e.g., P of FIG. 1 or P1 or P2 of FIG. 2) where the full aperture photodetector is either a photodiode or a pinned photodiode. The method further includes steps of accumulating additional photocharge in the full aperture photodetector, and then transferring the accumulated signal charge and the additional photocharge from the full aperture photodetector to a readout register (e.g., H in FIG. 1 or H1 or H2 in FIG. 2).

In a basic alternative embodiment, a TDI sensor includes a first readout register (cells H of FIG. 1 or cells H1 of FIG. 2) and a plurality of sensor columns (any of columns with cells G and P in FIG. 1 or with cells G, P1 and P2 of FIG. 2). The first readout register includes a plurality of first readout register elements (each cell of cells H of FIG. 1 or 2). A first sensor column (any of the sensor columns) includes a first photogate (e.g., a photogate adjacent to photodiode P in FIG. 1 or adjacent to photodiode P1 in FIG. 1) and a first diode photodetector at a first end (either P of FIG. 1 or P1 of FIG. 2). The first diode photodetector is either a first photodiode or a first pinned photodiode. The first photogate is coupled through the first diode photodetector and from there through a first transfer gate (either T of FIG. 1 or T1 of FIG. 2) to a corresponding first readout register element.

In an alternative embodiment, the first diode photodetector of the basic embodiment is a full aperture photodetector. Here, and elsewhere in this specification, full aperture photodetector, full aperture photodiode and full aperture pinned photodiode refers to a photodetector, photodiode or pinned photodiode that has an area substantially covering the entire area of a pixel. For example, referring to FIG. 3, a full aperture photodiode is defined as a photodiode that covers the pixel area defined by region 42 and bounded by channel stops 14. In such a region, there is no overlaying poly to be used in a poly gate to transport charge through the pixel.

In an alternative embodiment, the first sensor column of the basic embodiment includes a plurality of photogates (G in FIGS. 1 and 2). The first photogate of the basic embodiment constitutes one of the plurality of photogates of the first sensor column. The plurality of photogates constitute a stage selectable register. A number of stage selectable register techniques are known. In one, a vertical anti-blooming structure is used to drain excess charge into a substrate using a special potential applied to a clock line to shunt or short circuit the length of a CCD register. Typical of these techniques are the structures and methods disclosed in U.S. Pat. Nos. 5,929,471, 5,990,503 and 6,100,552 all incorporated herein by reference. Other techniques might use lateral drain gates to drain excess charge away from the register. Still other techniques transfer charges out a first predetermined number of register elements through the normal output, but then, drain charges in all remaining elements out of the back end of the register. No matter which technique is used, a column register of a TDI sensor having a predetermined number of elements in the column register can be shorted by these techniques to provide greater utility. For example, a sensor chip of 512 columns may be manufactured with 16 TDI stages. By using a stage selection technique, the same chip design can be operated to emulate a TDI column with any number of stages from 1 to 16. No new design is required.

In an alternative bi-directional embodiment (see FIG. 2), the TDI sensor of the basic embodiment further includes a second readout register that includes a plurality of second readout register elements (H2 in FIG. 2). The first sensor column further includes a second photogate (G adjacent to P2 in FIG. 2) and a second diode photodetector (P2 in FIG. 2) at a second end. The second diode photodetector is either a second photodiode or a second pinned photodiode. The second photogate is coupled through the second diode photodetector and from there through a second transfer gate to a corresponding second readout register element (H2 of FIG. 2).

In an alternative embodiment, the first and second diode photodetectors of the bi-directional embodiment are full aperture photodetectors. Here, and elsewhere in this specification, full aperture photodetector, full aperture photodiode and full aperture pinned photodiode refers to a photodetector, photodiode or pinned photodiode that has an area substantially covering the entire area of a pixel. For example, referring to FIG. 3, a full aperture photodiode is defined as a photodiode that covers the pixel area defined by region 42 and bounded by channel stops 14. In such a region, there is no overlaying poly to be used in a poly gate to transport charge through the pixel.

In an alternative embodiment, the first sensor column of the bi-directional embodiment includes a plurality of photogates (G in FIG. 2). The first and second photogates of the bi-directional embodiment constitute photogates of the plurality of photogates of the first sensor column. The plurality of photogates constitute a stage selectable register. A number of stage selectable register techniques are known. In one, a vertical anti-blooming structure is used to drain excess charge into a substrate using a special potential applied to a clock line to shunt or short circuit the length of a CCD register. Typical of these techniques are the structures and methods disclosed in U.S. Pat. Nos. 5,929,471, 5,990,503 and 6,100,552 all incorporated herein by reference. Other techniques might use lateral drain gates to drain excess charge away from the register. Still other techniques transfer charges out a first predetermined number of register elements through the normal output, but then, drain charges in all remaining elements out of the back end of the register. No matter which technique is used, a column register of a TDI sensor having a predetermined number of elements in the column register can be shorted by these techniques to provide greater utility. For example, a sensor chip of 512 columns may be manufactured with 32 TDI stages. By using a stage selection technique, the same chip design can be operated to emulate a TDI column with any number of stages from 1 to 32. No new design is required.

A TDI image sensor having an imaging region with a single row of full-aperture PD or PPD photoelements adjacent to the HCCD (or each HCCD in the case of a bi-directional sensor), improves the quantum efficiency and blue response of the image sensor, particularly in smaller columns where there are only a few TDI stages.

Furthermore, if implemented in a state-selectable TDI image sensor (as an alternative embodiment), which can be selected down to a single imaging row, the TDI image sensor operates as a linescan image sensor with no loss of quantum efficiency or blue response compared to that of a natural linescan image sensor.

Users of this technology achieve greater flexibility in tradeoffs between illumination intensity, light sources, and object-imager alignment tolerances. The present invention bridges a gap in object-image sensor movement alignment and synchronization requirements between traditional linescan and TDI imagers. This gap between traditional linescan and TDI imagers is caused by the quantum efficiency differences between conventional photodiode (or pinned photodiode) structures and photogate structures. Designing a TDI sensor without the disclosed technology to achieve a small increase in response over a comparable linescan sensor requires an unexpectedly large number of imaging rows to obtain signal levels due to the low quantum efficiency of photogates compared to photodiodes and pinned photodiodes, particularly in their response to blue light.

Having described preferred embodiments of a novel TDI imager architecture with a row of pinned photodiodes (which are intended to be illustrative and not limiting), it is noted that the modifications and variations can be made by persons skilled in the art in light of the above teachings. For example, the invention encompasses a sensor that includes a means for passing photocharge from a photo gate (e.g., G) into a photodiode (e.g., P) and a means (e.g., T) for transferring the photocharge from the photodiode to a readout register (e.g., H). Such means for passing includes overlaying polycrystalline clocking lines, and such means for transferring include a transfer gate structure as discussed above. It is, therefore, to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A TDI sensor comprising a first readout register and a plurality of sensor columns, wherein:
    the first readout register includes a plurality of first readout register elements;
    a first sensor column includes a first photogate and a first diode photodetector at a first end, the first diode photodetector being one of a first photodiode and a first pinned photodiode; and
    the first photogate is coupled through the first diode photodetector and from there through a first transfer gate to a corresponding first readout register element.

2. The sensor of claim 1, wherein the first diode photodetector is a full aperture photodetector.

3. The sensor of claim 2, wherein:
    the first sensor column includes a plurality of photogates;
    the first photogate constitutes one of the plurality of photogates of the first sensor column; and
    the plurality of photogates constitute a stage selectable register.

4. The sensor of claim 1, wherein:
    the first sensor column includes a plurality of photogates;
    the first photogate constitutes one of the plurality of photogates of the first sensor column; and
    the plurality of photogates constitute a stage selectable register.

5. The sensor of claim 1 further comprising a second readout register that includes a plurality of second readout register elements, wherein:
    the first sensor column further includes a second photogate and a second diode photodetector at a second end, the second diode photodetector being one of a second photodiode and a second pinned photodiode; and
    the second photogate is coupled through the second diode photodetector and from there through a second transfer gate to a corresponding second readout register element.

6. The sensor of claim 5, wherein the first and second diode photodetectors are full aperture photodetectors.

7. The sensor of claim 6, wherein:
    the first sensor column includes a plurality of photogates;
    the first and second photogates constitute photogates of the plurality of photogates of the first sensor column; and
    the plurality of photogates constitute a stage selectable register.

8. The sensor of claim 5, wherein:
    the first sensor column includes a plurality of photogates;
    the first and second photogates constitute photogates of the plurality of photogates of the first sensor column; and
    the plurality of photogates constitute a stage selectable register.

9. A method comprising steps of:
    accumulating a first photocharge in a photogate;
    transferring the first photocharge from the photogate to a photodiode;
    accumulating a second photocharge in the photodiode; and
    transferring both the first and second photocharge from the photodiode to a readout register cell.

10. The method of claim 9, further comprising steps of:
    accumulating a third photocharge in the photogate while the step of accumulating a second photocharge accumulates the second photocharge in the photodiode; and
    transferring the third photocharge from the photogate to the photodiode while the step of transferring both the first and second photocharge transfers both the first and second photocharge from the photodiode to the readout register cell.

11. The method of claim 9, further comprising a step of:
    scanning a portion of an image conjugate of a scene to be imaged from the photogate to photodiode in the span of a first time interval, wherein
    the first time interval is substantially equal to a time interval between when the step of transferring the first photocharge transfers the first photocharge from the photogate to a photodiode and when the step of transferring both the first and second photocharge transfers both the first and second photocharge from the photodiode to the readout register cell.

12. A method comprising steps of:
    transferring accumulated signal charge from a TDI column into a full aperture photodetector, the full aperture photodetector being one of a photodiode and a pinned photodiode;
    accumulating additional photocharge in the full aperture photodetector; and
    transferring the accumulated signal charge and the additional photocharge from the full aperture photodetector to a readout register.

13. A method according to claim 12, wherein the readout register is a CCD readout register.

14. A method according to claim 13, wherein the transferring of the accumulated signal charge from the TDI column includes transferring the accumulated signal charge from a photogate to the full aperture photodetector.

15. A method according to claim 13, wherein the transferring of the accumulated signal charge from the TDI column includes transferring the accumulated signal charge from a reticulated photogate to the full aperture photodetector.

16. A method according to claim 13, wherein the transferring of the accumulated signal charge and the additional photocharge includes:
    applying a transfer pulse to a transfer clock line; and
    applying a transfer pulse to a register clock line of the CCD readout register.

17. A method according to claim 13, wherein the transferring of the accumulated signal charge and the additional photocharge includes:

applying a first transfer pulse to a transfer clock line for a first predetermined time; and applying a second transfer pulse to a register clock line of the CCD readout register for a time period beginning when the first transfer pulse is applied to the transfer clock line and ending a second predetermined time after the first transfer pulse is no longer applied to the transfer clock line.

* * * * *